United States Patent
Fujita et al.

(10) Patent No.: US 7,068,207 B2
(45) Date of Patent: Jun. 27, 2006

(54) DEVICE FOR OPERATING ELECTRONIC APPARATUS. RECORDED MEDIUM AND ELECTRONIC APPARATUS

(75) Inventors: Takeshi Fujita, Chiba (JP); Hitoshi Endoh, Saitama (JP); Nariaki Hatta, Tokyo (JP); Yasufumi Fujikawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 447 days.

(21) Appl. No.: 10/296,803

(22) PCT Filed: May 29, 2001

(86) PCT No.: PCT/JP01/04508

§ 371 (c)(1),
(2), (4) Date: Nov. 26, 2002

(87) PCT Pub. No.: WO01/93624

PCT Pub. Date: Dec. 6, 2001

(65) Prior Publication Data

US 2003/0146846 A1 Aug. 7, 2003

(30) Foreign Application Priority Data

May 30, 2000 (JP) ............................ P2000-161253
May 15, 2001 (JP) ............................ P2001-145560

(51) Int. Cl.
*H04L 29/00* (2006.01)

(52) U.S. Cl. .................... 341/176; 340/825.72

(58) Field of Classification Search ................ 341/176; 340/825.72, 825.37, 825.69; 345/69
See application file for complete search history.

(56) References Cited

U.S. PATENT DOCUMENTS 4,728,949 A   3/1988  Platte et al.
5,237,327 A   8/1993  Saitoh et al.

FOREIGN PATENT DOCUMENTS

EP   0 928 073   7/1999

OTHER PUBLICATIONS

Mizuo Nishibayashi, OS Series, vol. 6, Macintoshi, 1st edition, 5th printing, Kyoritsu Shuppan K.K., Mar. 20, 1988, pp. 30 to 35; 5.1 Resource, 5.2 Resource file; table 5.1; Fig. 5.3.

*Primary Examiner*—Michael Horabik
(74) *Attorney, Agent, or Firm*—Frommer Lawrence & Haug LLP; William S. Frommer; Thomas F. Presson

(57) ABSTRACT

The present invention aims to share such a unit for controllably operating a wide variety of electronic apparatuses to be uniformly compatible with each of them. Concretely, such data pictures comprising picture data and relevant data as a single dealing unit are utilized. Data pictures are individually displayed on a display unit of the inventive operating device to enable user to specify (305) any of them. When a certain data picture has been specified by user's operation, a relevant data is extracted (307) from the specified data picture, and then, based on the extracted relevant data, a controlling data is transmitted.

8 Claims, 6 Drawing Sheets

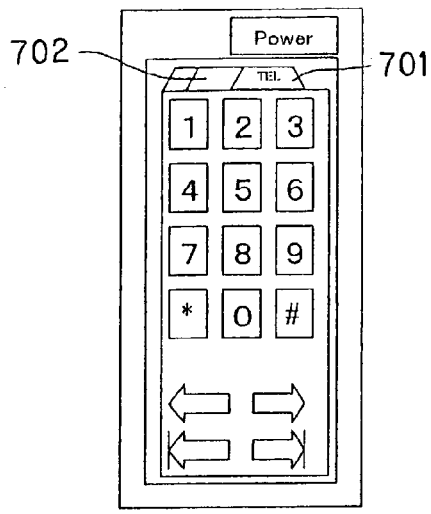
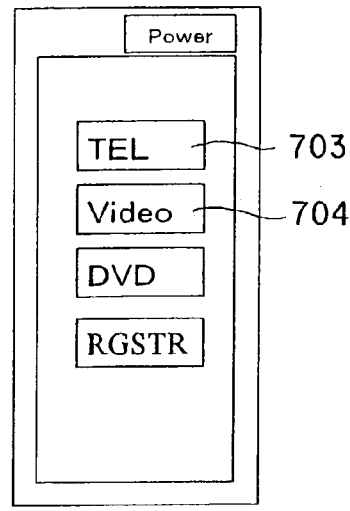
FIG. 7A    FIG. 7B
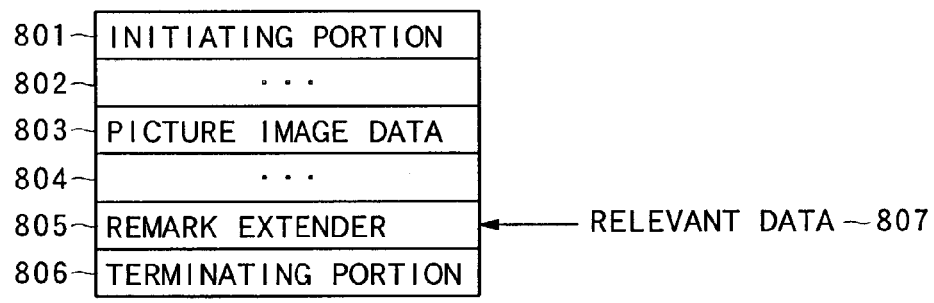
FIG. 8
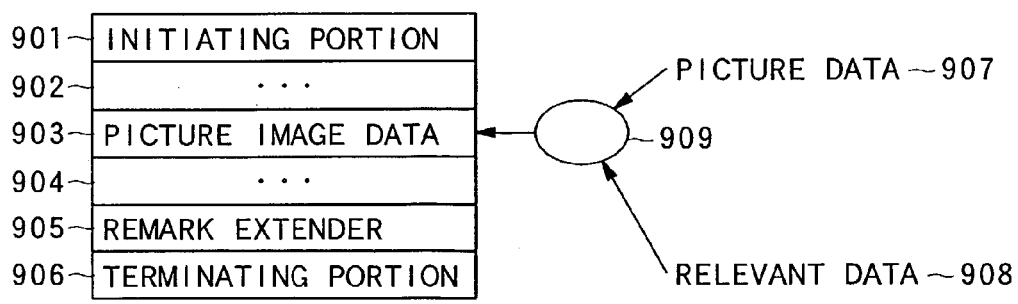
FIG. 9

DEVICE FOR OPERATING ELECTRONIC APPARATUS. RECORDED MEDIUM AND ELECTRONIC APPARATUS

TECHNICAL FIELD

The present invention relates to an operating device for remotely controlling electronic apparatuses. More particularly, the present invention relates to such a remote controllable operating device compatible with a variety of manually operable electric/electronic apparatuses mainly including portable data communication terminal apparatuses, television sets, video recorders, refrigerators, microwave ovens, or the like.

BACKGROUND ART

In the field of a variety of electronic apparatuses, such a remote controller utilizing infra-red rays for the medium of communication has been generalized in recent years.

Nevertheless, although functional operation of these remote controllers is basically analogous to each other, when there are various kinds of electronic apparatuses being subject to a variety of controllable conditions, it necessitates provision of a number of remote controllers corresponding to the actual number of the electronic apparatuses to be controlled. This in turn obliges users to be annoyed with such a work for picking up the correct remote controller exactly matching the apparatus that should be operated. Although there has been such a move to unify the standard of remote controllers being manufactured, actually, standard unification has merely been realized by each manufacturer of corresponding electric/electronic apparatuses on the individual basis. Actually, it is extremely difficult to integrally unify the standards of remote controllers among concerned manufacturing companies. Aside from this, inasmuch as individual manufacturers are obliged to provide customers with a plurality of remote controllers analogous to each other per specific electric/electronic apparatus on the market, this obligation further obstructs reduction of production cost.

DISCLOSURE OF THE INVENTION

The present invention provides such a novel device for controllably operating electronic apparatuses. More particularly, the operating device is uniformly compatible with a variety of manually operable electric/electronic apparatus including potable data communication terminal apparatuses, television sets, video recorders, refrigerators, microwave ovens, or the like. The operating device enables individual users to properly operate any of those apparatuses cited above by referring to illustrated characters shown on a display window of the corresponding apparatus in order that the corresponding electronic apparatus can properly be operated by an individual user based on such a data corresponding to a selected illustrated character individually meaning a specific data shown on the display window thereof. The inventive operating device enables individual users to controllably operate any of the corresponding electric/electronic apparatuses by referring to illustrated characters shown on a display window of the apparatus in order that the corresponding apparatus can controllably be operated based on such a data corresponding to the selected illustrated character individually meaning a specific data.

The present invention has been realized by way of solving the above-cited problem thus far existing among the concerned. As will be described below, the present invention aims at facilitating integral unification of remote controllers or reducing cost of a variety of electric/electronic apparatuses by way of communizing interfaces inside of operating mechanism.

To realize the above objects, the present invention positively utilizes such a data unit comprising a package of relevant data including such illustrated data represented by "icon" symbols and such related data designating contents of operations to be executed whenever any of the illustrated data has been specified. The data unit as a package is hereinafter referred to as "data pictures".

The present invention discloses such an operating device for controlling operation of individual electronic apparatuses, wherein the operating device initially displays at least one of picture-image data components contained in data pictures on a display to enable the operating device to specify the picture-image data on display via an operation. Next, the operating device extracts relevant data from the specified data pictures, and then, based on the extracted relevant data, the operating device externally delivers such a data required for controlling operation of other electronic apparatuses.

The present invention discloses such an operating device for controlling operation of individual electronic apparatuses, wherein the operating device of the present invention comprises a display device which displays at least one of picture-image data components contained in data pictures, a specific operation executing device, a relevant-data extractor, and an interface device.

The display device is disposed on the operating device, which displays at least one of picture-image data components among predetermined data pictures to enable an operator to visually confirm it. The specific operation executing device functions itself so as to extract picture-image data displayed on the display device which is disposed at a position enabling an operator of the operating device to specify the displayed picture-image data. The relevant-data extractor functions itself so as to extract a relevant data from the data pictures. Based on the relevant data, the interface device externally delivers controlling data to such apparatuses outside of the operating device. In such a case in which an encoding system is present between the relevant data and the data to be output, an encoder may be provided. In this case, it is allowable to function the encoder to effect conversion into corresponding encoding system based on the relevant data extracted by the specific-operation executing device.

Further, the present invention also discloses such an operating device for controlling operation of individual electronic apparatuses, wherein the operating device is capable of externally delivering a controlling data to externally controllable objects via wireless transmission executed via the interface device. Applicable wireless transmission format comprises the "IrDA" of an infra-red communication standard and the "Bluetooth" of a high-frequency communication standard, for example. Irrespective of available frequency, the inventive operating device enables transmission of data to all the electronic apparatuses actually being operated by applying the above-cited communication standards.

The present invention further discloses such a novel operating device for controlling operation of individual electronic apparatuses based on such an assumption that recording medium containing data pictures is packaged together with such an operable electronic apparatus assigned to a third party via transaction, which are then utilized by the assignee by way of inserting those recording media into an electronic apparatus or into a remote controller for example. In other words, in this case, the recording media function themselves so as to provide the operating device with such data contents related to such a data picture to be displayed on the surface of the operating device.

The present invention further discloses such a novel operating device for controlling operation of individual electronic apparatuses based on such an assumption that recording medium containing data picture is packaged together with such an operable electronic apparatus assigned to a third party via transaction, which are then added with new data picture via a detachable interface device usable as a remote controller, whereby making it possible to realize such a remote controller which is operable in common with other electronic apparatuses.

The present invention further discloses such a novel operating device for controlling operation of individual electronic apparatuses based on such an assumption that picture image data are recorded in an operable electronic apparatus to enable the remote-controllable device to download the recorded picture-image data. In other words, the present invention provides such a novel operating device for controlling functional operation of individual electronic apparatuses incorporating a data picture recorder and a recording medium interface device.

The data picture recorder records the data pictures cited above. The recording medium interface device reads the data recorded from an apparatus to be subject to control and then functions to record the recorded data in the data picture recorder.

The present invention further discloses such an operating device for enabling a single remote controller to operate a plurality of electric/electronic apparatuses. More particularly, the operating device comprises a display device, a specific operation executing device, a relevant data extracting device, and an interface device. In this operating device, it is so arranged that all the picture-image data are subject to display after being classified into groups per data-lot usable for operating each of electric/electronic apparatuses which are subject to the controlling operation.

BRIEF DESCRIPTION OF THE DRAWINGS

FIGS. 7A and 7B exemplify contents of display shown by the electronic apparatus operating device according to the second form for implementing the present invention;

FIG. 8 exemplifies a process for transplanting relevant data into picture-image data; and FIG. 9 exemplifies another case of transplanting relevant data into picture-image data.

BEST MODE FOR CARRYING OUT THE INVENTION

Figure 1:
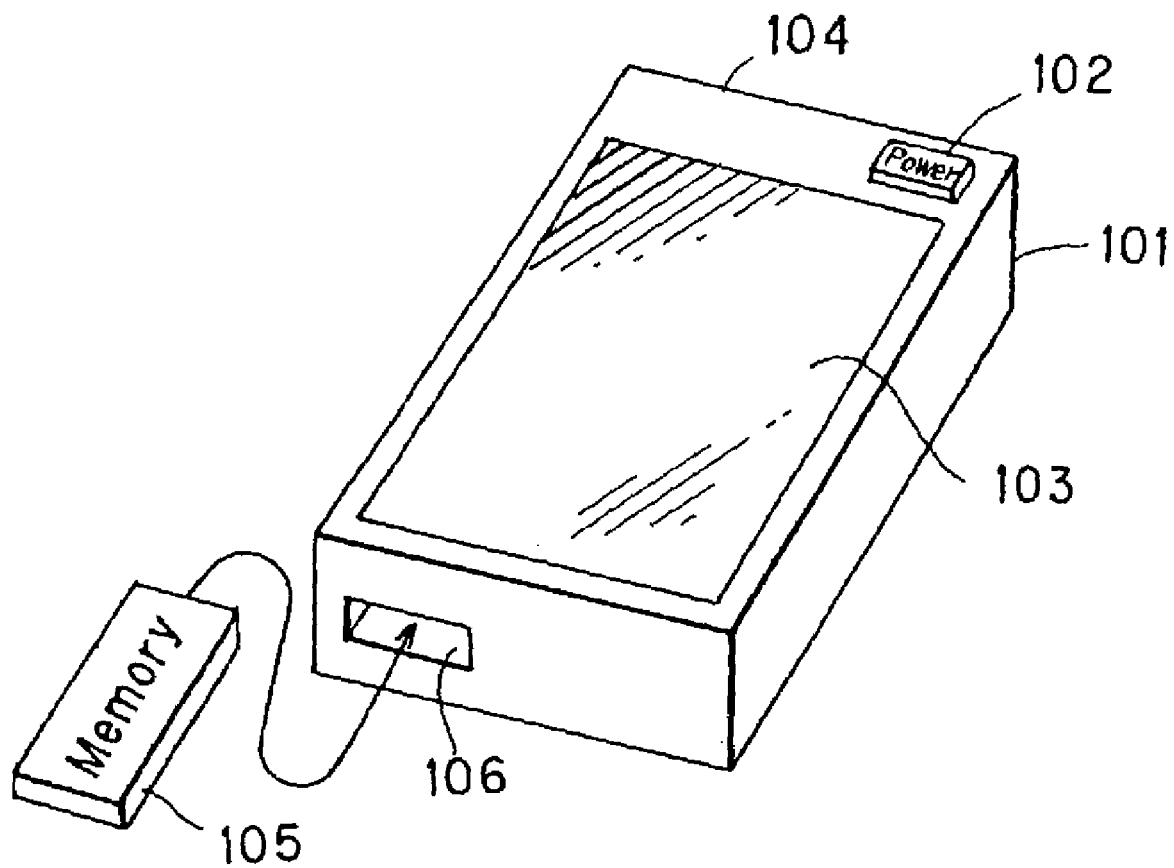
FIG. 1 presents an overall perspective view of the device for controllably operating an electronic apparatus related to the present invention.

Next, referring to FIGS. 1 to 9, preferred embodiments of the present invention are described below.

(1) Common Concept:

First, basic conception in common with practical forms for implementing the present invention is described below.

1-1: Relevant Data:

The basic conceptual relevant data used in common with the practical embodiments of the present invention is described below.

The term "relevant data" constitutes such a basic data to be utilized by an operator of the operating device whenever he intends to activate a specific operation of an objective electric/electronic apparatus by referring to data picture. In other words, the relevant data literally comprises such a data related to a data picture or a picture-image data. In the practical form of the present invention, the relevant data comprises such a data for controlling operation of an external electric/electronic apparatus (objects to be controlled) or such a basic data for composing a controlling data.

Further, when utilizing such a data picture, to be described later on, for other uses, the relevant data is not solely limited to the above-cited controlling data. Further, when it is so required to have operators of terminal equipment extensively refer to such a data preserved in a specific server, the above relevant data may include such a data (URL and IP address for example) for specifying the data held by a specific server. Further, when an operator intends to activate operation of a specific program, said relevant data may comprise name of a specific program or the program itself. It is of course possible to utilize said relevant data as an instruction data to procure new data picture from an electronic apparatus. Further, the above relevant data may merely designate a specific letter, a specific numerical value, or a specific symbol, as well.

1-2: Data-picture:

Next, referring to FIGS. 8 and 9, data picture is described below. As described above, the data picture at least comprises data of picture image visually shown on the above-referred display device as the picture data and also comprises the above-referred relevant data. Further, in order to specify the above data picture, an identifier may also be included.

FIG. 8 exemplifies a typical format of a data picture added with a relevant data. In FIG. 8, the exemplified data picture comprises a GIF-format picture image. Not only the GIF-format, but the JPG format or the PCX format may also be introduced. Initiating portion 801 corresponds to such a field for identifying that the present data conforms to the GIF-format picture-image data, in which an array of characters "GIF" and the version of its GIF-format are allocated.

A color table type picture-image data 803 conforming to a coloring table comprises a plurality of color elements aligned from the left to the right and from the upper rank to the lower rank. The GIF-format picture image data are encoded by applying an LZW algorithm based on variable length ciphers.

Remark-extender 805 may include any data other than such graphic data sharing main part of the GIF data stream. For example, the remark-extender 805 may include any kind of data normally not being utilized for a direct display such as subsidiary graphic data, data of the names of those who are concerned with manufacturing process, annotating data in regard to the main graphic data, and controlling data, for example.

Terminating portion 806 designates that the above-referred data stream is terminated to imply that no other parameter data will follow. An interval portion 802 between the initiating portion 801 and the picture-image data 803 conforming to a coloring table and another interval portion 804 between the picture-image data 803 and the remark-extender 806 respectively contain those data other than the above-cited one. For example, such data containing parameter for defining the data essential for those picture image to be drawn henceforth, where the data includes width and height of picture, color resolution, or the like, for example.

Relevant data 807 is disposed and integrated into a single data in the above-referred remark extender 805 as of the actual condition or after being treated with a specific ciphering process. Accordingly, in consequence, the picture image data can be distinguished from other data by means of an identifier, whereby the picture-image data internally contains such data related to specific operation and the identifier. Although the above operations are solely executed in conformity with the GIF-format, insofar as those data other than the picture image data can be recorded on specific domains discretely from picture-image data, any format other than the GIF-format may also be introduced.

Referring now to FIG. 9, a format for burying the above relevant data into data picture is described below.

FIG. 9 exemplifies another format of a data picture added with such a relevant data 908 pertaining to data of specific operations. The data picture shown in FIG. 9 also introduces such picture image conforming to the GIF format. Like the above case, not only the GIF format, but either the JPG format or the PCX format may also be utilized.

Like the above example, initiating portion 901 corresponds to such a field provided for identifying that the present data comprises such a picture image data conforming to the GIF-format. Such an array of characters "GIF" and a version thereof are allocated in the initiating portion 901.

In the preceding example, a color table type picture image data 903 conforming to a coloring table comprises such picture image data in which picture elements are respectively aligned from the left to the right and from the upper rank to the lower rank. However, in the present example, it is so arranged that, by way of mixing at a mixer 909 the specific operation data 908 as one of the relevant data via water-mark form, the specific operation data 908 is not visually discernible as of the actual condition even when displaying picture image data, whereas picture image data is visually discernible as of the actual condition. Next, the mixed data mixed at the mixer 909 is subject to an encoding process by applying an LZW algorithm based on variable length ciphers.

Normally, the remark extender 905 contains such data other than the graphic data of the GIF data stream. Although the remark extender 905 corresponds to such a field not always necessary for the present example, it is also possible for a data provider to utilize it based on free definition as required. It is also possible to include any relevant data other than the specific operation data in the remark extender 905.

Terminating portion 906 designates that the above data stream is terminated, whereby implying that no other parameter data will follow.

The above descriptions have respectively referred to such picture image data conforming to the GIF-format. However, insofar as the relevant data can be recorded discretely from the picture image data, such a picture image data conforming to other formats may also be utilized. These data pictures may be synthesized at any processing stage. For example, these data pictures may be synthesized via any processing stage until these data pictures are recorded by a data image recorder set inside of the inventive operating device, for example, at the initialized stage of such an electronic apparatus under operation, or at the time of delivery of those electronic apparatuses from a manufacturer's factory.

2: The First Practical Form:

Referring now to FIGS. 1 to 4, the first practical form of the present invention is described below.

Figure 3:
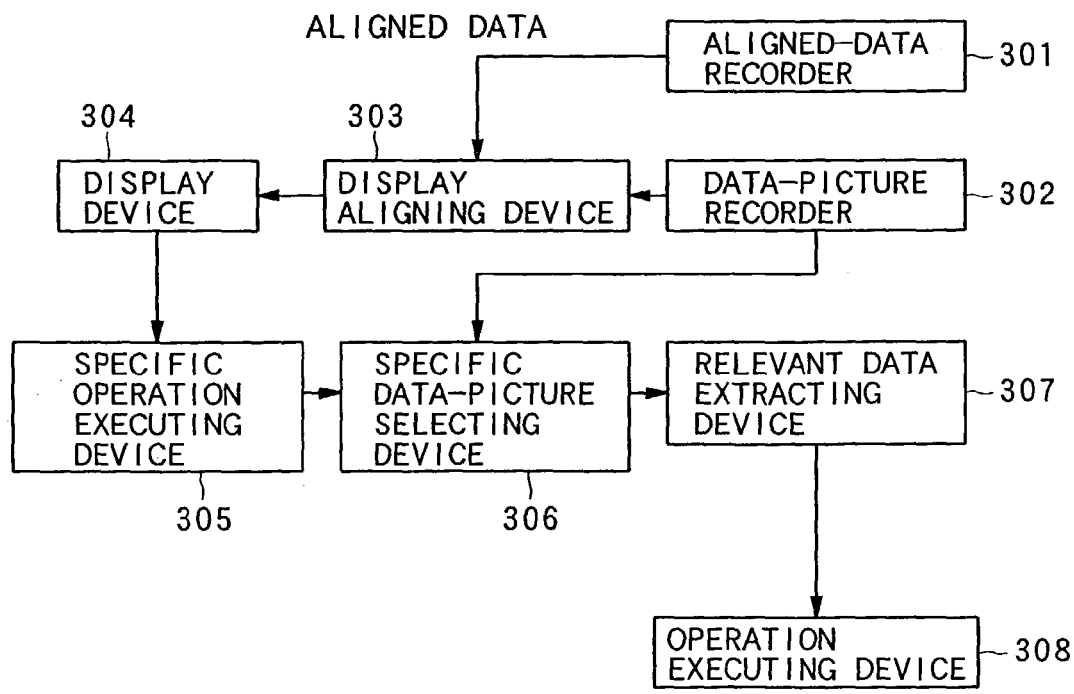
FIG. 3 presents a schematic block diagram of essential components of the electronic-apparatus operating device according to the first form for implementing the present invention.

2-1: Construction of Essential Components in the First Practical Form:

First, referring to FIG. 3, construction of essential components in the first practical form of the present invention is described below. When implementing the first practical form of the present invention, by way of constituting the essential components as a physically independent module, the integrated module can function itself as an operating unit in a variety of electronic apparatuses. This in turn makes it possible to utilize the integrated module in common with a variety of electronic apparatuses during manufacturing stage. Further, as will be described later on, it is also possible to have it function as a remote controller operable in common with a variety of electronic apparatuses after being combined with other elements.

Aligned-data recorder 301 specifies such a data picture that should be displayed, and yet, it also records such a data for specifying a specific location of the display device 304 at which the relevant data picture should be displayed. For example, the above data recorder 301 records such an HTML file which designates the name of file for specifying a data picture and also designates its layout via a tag description.

Data-picture recorder 302 records at least such a data picture that should be displayed.

Display aligning device 303 receives data from the aligned-data recorder 301 and data-picture recorder 302 based on the data recorded by these recorders 301 and 302, and then, the display aligning device 303 determines such a picture data to be displayed on the display 304 and also determines layout of the picture data to be displayed. In other words, the display aligning device 303 receives an alignment data from the aligned-data recorder 301, and then analyzes contents of the received alignment data. Based on the analyzed result, the display aligning device 303 extracts an identifier of data picture that should be displayed from the data-picture recorder 2 before eventually determining the layout of the picture data to be displayed.

The display device 304 is disposed on the inventive operating device, where the display device 304 displays at least one of those data pictures to enable users to visually discern it.

Based on such a data generated by the display device 304 or by the above display aligning device 303, specific operation executing device 305 acquires positional data related to the specified picture-image data when a certain picture image data displayed on the display device 304 is specified by an operator. In this case, by way of utilizing a so called a "touch display panel" for example, it is possible to realize the display device 304 and the specific operation executing device 305 by means of a single device.

Based on such a data received from the specific operation executing device 35 and such a data recorded by the data picture recorder 302, specific data-picture selecting device 306 specifies such a data picture relevant to the picture data specified by an operator and then receives the corresponding data picture from the data picture recorder 302.

Based on such a data received from the specific data picture selecting device 306, relevant data extracting device 307 extracts relevant data out from the specified data pictures.

Based on such a data received from the relevant data extracting device 307, operation executing device 308 functions itself as an interface device which converts the extracted relevant data into such a code that can be interpreted by an electronic apparatus under operation and then outputs the encoded data. Inasmuch as controlling data itself is included in the relevant data, when such an encoding process is not required, the operation executing device 308 outputs the controlling data as of the condition.

2-2: Operation of Essential Components in the First Practical Form:

Next, functional operation of essential components related to the first practical form of the present invention is described below.

The above-referred display aligning device 303 reads the alignment data from the above aligned data recorder 301. Then, in accordance with the contents of the aligned data, the display aligning device 303 specifies a data picture that should be displayed. The specified picture data is delivered from the above-referred data picture recorder 302. Next, layout of the specified data picture is determined before being displayed on the display device 304. Inasmuch as the picture image related to the displayed data picture is visually discernible by an operator, the operator then specifies any of these picture images that can be identified as an "icon" via the specific operation executing device 305. This in consequence enables the specific operation executing device 305 to identify the specified position and the act of specifying the above picture image. The term "specific operation" corresponds to an act of depressing the picture-displayed portion with a finger or a stylus pen when a touch display panel is applied. When the act of identifying the specific operation is detected, a single data picture is specified via the function of the specific data picture selecting device 306, which then reads the contents of the specified data picture. Next, the relevant data extracting device 307 extracts the data related to the specified data picture, and then the extracted data picture is encoded by the operation executing device 308 before eventually being delivered to an electronic apparatus subject to the control of the operating device.

Inasmuch as relevant data is previously buried in data pictures, by way of setting the contents to be recorded by the data picture recorder 302 and the aligned data recorder 301 to be compatible with such an electronic apparatus to be subject to control, despite of identical construction, those essential components of the inventive operating device can properly control operation of a variety of electric and electronic apparatuses.

2-3: Other Variations of the Essential Components:

Of those essential components of the inventive device, the above referred aligned data recorder 301 may be deleted. More particularly, since the lay-out structure formed by the display aligning device 303 is predetermined, in such a case in which any change of operating system is not required for a controllable electronic apparatus, there is no need to provide the aligned data recorder 301. In this case, based on the predetermined lay-out, data picture recorded in the data picture recorder 302 is laid out before displaying it on the display device 304. Although it is necessary to initially select a data picture from the data picture recorder 302 and then determine the display order, in this case, such a rule shall be established, which causes all the data pictures recorded in the data picture recorder 302 to be displayed. Alternatively, in such a case in which a predetermined data picture recorded in the data picture recorder 302 is merely displayed based on a predetermined layout, it is allowable to provide such a recording device for independently recording specific data related to the data picture to be displayed.

2-4: Examples Derived from the First Practical Form:

Next, referring to FIG. 4, practical form of applying the structure of the above essential components based on the first practical form of the present invention to the formation of a remote controller is described below.

Inasmuch as the essential components 401 of the operating device respectively consist of the structures and executes own operations in the same way as is described above by referring to FIG. 3, description thereof is deleted.

Recording medium reading device 402 incorporates a mechanical or electronic connection device for accommodating a recording medium 405 via installation or insertion. The connection device may be of contact format or non-contact format. The recording medium reading device 402 transmits the contents recorded on the recording medium 405 to an aligned data recorder or/and a data picture recorder included in the essential components 401 of the inventive operating device 401. On the other hand, the recording medium 405 at least contains specific data pictures previously prepared and recorded by a corresponding manufacturer. In addition, it also contains such an alignment data to be recorded by an aligned data recorder as required. It is so arranged that the recording medium 405 can be utilized via installation or insertion into the inventive operating device for use with an electronic apparatus.

To simplify structural configuration, it is possible to integrate the above-referred aligned data recorder, data picture recorder, recording medium reading device, and the recording medium. Concretely, since the recording medium can be accessed as a conventional memory, even when deleting transfer of the contents of the recording medium to the aligned data recorder and the data picture recorder, by causing the display aligning device to directly access the recording medium 405, it is possible to complete functional operation of the inventive operating device.

Transmission device 403 receives specific codes prepared by an operation executing device included in the essential components 401 of the inventive operating device and then transmits the received codes to a corresponding electronic apparatus subject to the control of the inventive operating device. In the illustrated example, since infra-red rays are utilized for transmission of the coded signal, an infra-red ray LED 404 is driven. However, in place of infra-red rays, it is also allowable to utilize electromagnetic waves by way of applying such a protocol for implementing local communication like the "Bluetooth" proposed by Erikson Company for example. Needless to mention that the driving target is not LED, but it should be an antenna in this case.

Figure 2:
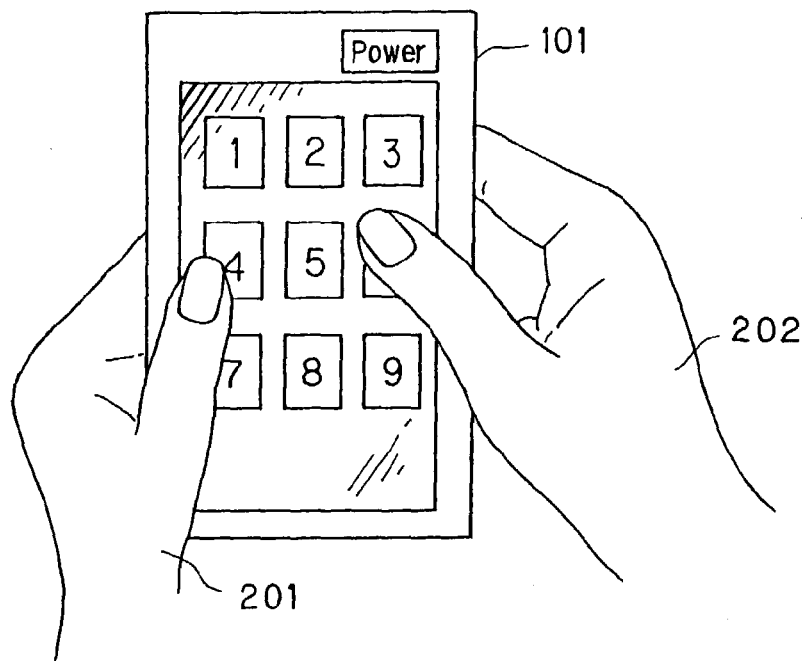
FIG. 2 presents a schematic diagram for explanatory of operations of the device for controllably operating an electronic apparatus related to the present invention.
Figure 4:
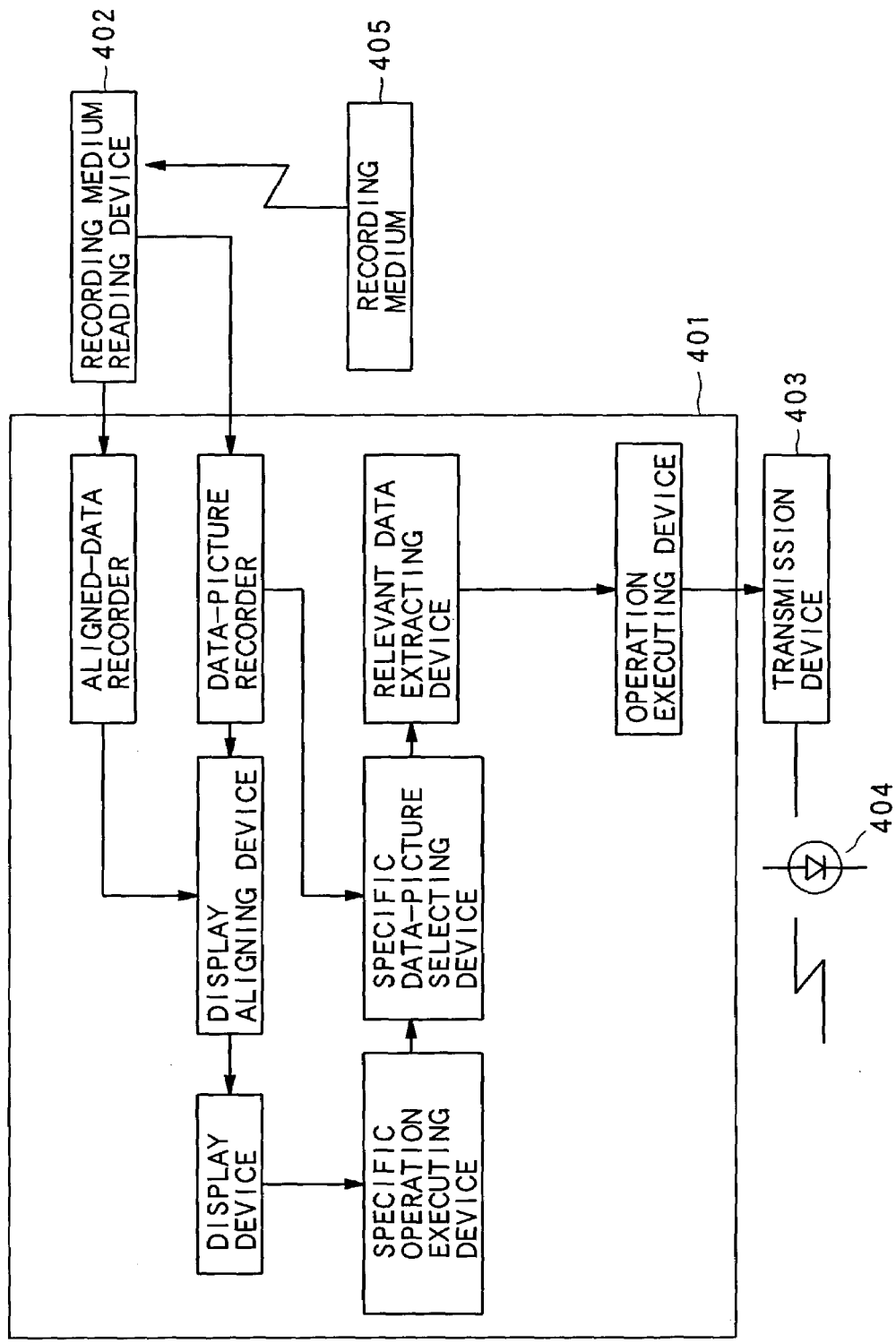
FIG. 4 exemplifies a schematic block diagram of the electronic apparatus operating device as another aspect of the first form for implementing the present invention.

2-5: Example of Configuration of the Operating Device According to the First Practical Form:

Referring now to FIGS. 1 and 2, external configuration of the inventive operating device for use with an electronic apparatus suitable for composing the structure related to the practical form shown in FIG. 4 is described below.

Those components disposed on the chassis 101 includes a power supply switch 102, a manual touch type display panel 103 for activating display and functional operations of the operating device, an infra-red-ray transmitter 104, and an insertion hole 106 for inserting a recording medium 105 therein. As shown in FIG. 2, the chassis 101 of the inventive operating device is manually held by both hands 201 and 202. By way of depressing the spot right above the picture data displayed on the display panel 103 with a thumb, operator can specify such a data picture related to the corresponding picture data. As a matter of course, even when introducing any other form aside from the above layout, no problem will be generated. For example, in such a case in which the essential components of the inventive operating device shown in FIG, 3 are utilized for operating components of a micro-wave oven or a refrigerator for example, except for the above-referred manual touch type display panel 103, all the rest portions will bear totally different external forms.

Figure 5:
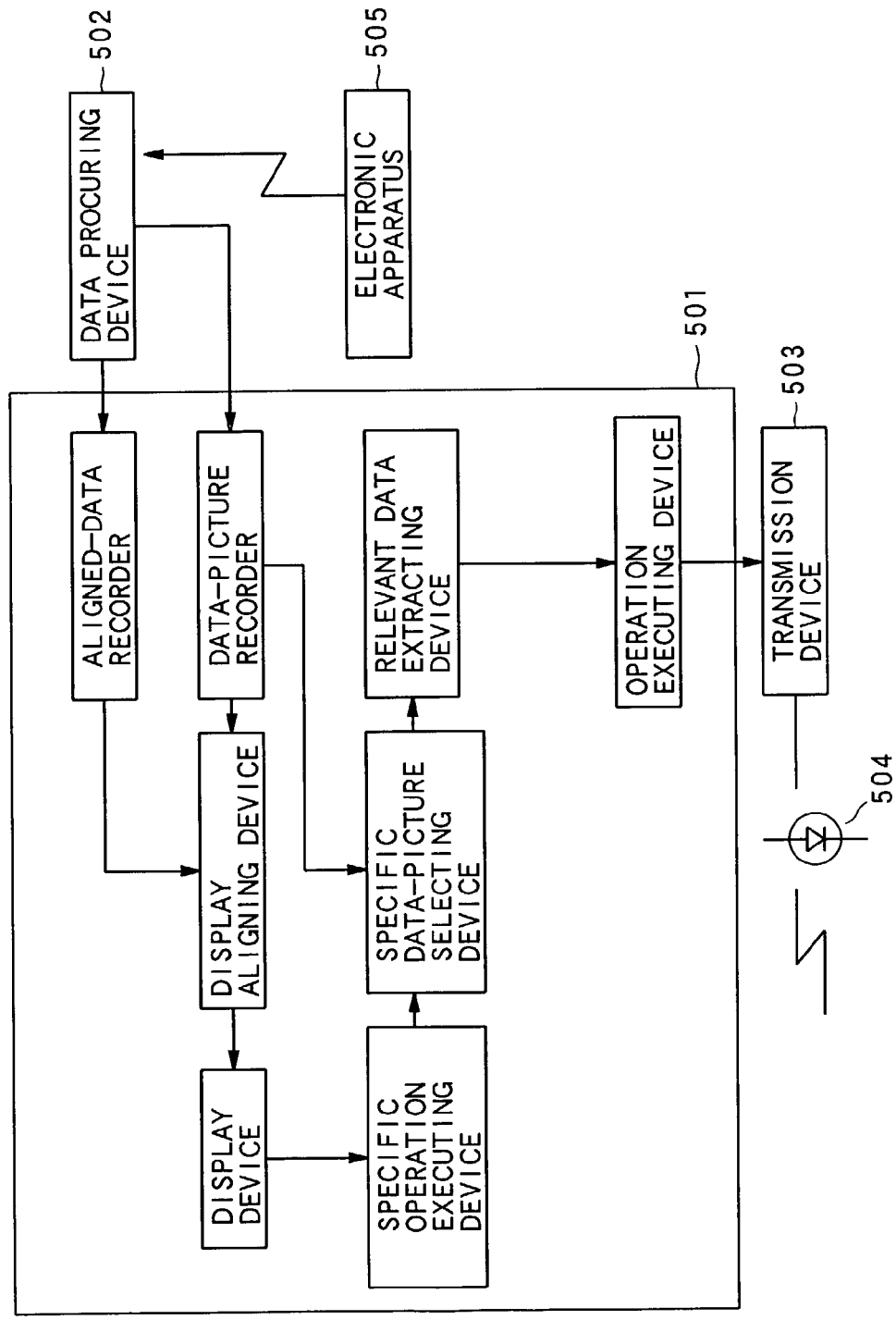
FIG. 5 exemplifies a schematic block diagram of the electronic apparatus operating device as a still further aspect of the first form for implementing the present invention.

2-6: Other Structures and Operations Derived from the First Form:

Referring now to FIG. 5, another example of the inventive operating device derived from the first practical form of the present invention is described below. Unlike the preceding first practical form for implementing the present invention in which data pictures and alignment data are delivered from a recording medium, in the present example, data pictures and alignment data are directly procured from an electronic apparatus to be subject to control. Concretely, in this example, the above data are delivered to the data-picture recorder and the aligned data recorder from a data procuring device 502. The essential components 501 of the inventive operating device related to this example are exactly identical to the one described earlier by referring to FIG. 3, and thus, description thereof is deleted. The data procuring device 502 receives data from an electronic apparatus 505 as the controllable object linked with the inventive operating device and then functions itself to enable the above aligned data recorder and data picture recorder to individually record the received data therein. Structures of the transmission device 503 and infra-red-ray LED 504 are exactly identical to those provided for the preceding inventive device described earlier by referring to FIG. 4. Depending on cases, it is so arranged that the inventive operating device according to this example transmits a control-operation data to such an electronic apparatus as the controllable object by applying such a wireless communication means including the "Bluetooth" standard as cited above.

There are a variety of variations in terms of the timing for procuring data from a corresponding electronic apparatus 505. Concretely, it is possible to procure the required data from such an electronic apparatus 505 linked with the inventive operating device simultaneous with activation of power-supply switch for example. In addition, it is also possible to procure the required data from the linked electronic apparatus 505 simultaneous with manual operation of an operator to depress a reset switch specially added to the inventive operating device. The term "linkage" may designate such a specific relationship between the inventive operating device and a corresponding electronic apparatus that exists in the direction in which directivity is present in the case in which the inventive operating device exerts directivity as a device for executing reception and transmission of data signal. In other words, the inventive device may be in such a relationship with such an electronic apparatus which enables the inventive operating device to receive data signal the most intensely. Alternatively, the inventive operating device may be in such a relationship with such a corresponding electronic apparatus bearing a predetermined carrier wave (or superimposed signal). Further, the inventive operating device may be in such a relationship with such a corresponding electronic apparatus being related via a special man-machine interface for example.

2-7: Another Example of the First Form Via a Portable Telephone Set:

As described above, practical form of the present invention is widely applicable to a variety of electric/electronic apparatuses such as refrigerators, microwave ovens, or the like. Further, the inventive operating device is also applicable to a variety of portable telephone sets which are recently generalized in consumer's market. Inasmuch as versatile functions are built in each of the portable telephone sets in these days, multiple functions are exerted overlappedly by way of operating a single button, whereby degrading operating performance. To cope with this problem, by way of providing a portable telephone set with a picture-data button for display to enable display of different picture data relative to the change of function via manual operation of user, it is realizable to drastically promote operating sense. In this case, function designers are merely responsible for producing data pictures on the independent basis to enable them to execute so-called "object-oriented" design capable of easily developing complex programs, whereby it is expected that term for the design work can be contracted.

2-8: Transformation of Essential Components:

Essential components of the inventive operating device based on the first practical form of the present invention may be subject to transformation by way of the following: Concretely, as shown in FIG. 3, instead of directly connecting the above-referred display aligning device 303 to the display device 304, data pictures can be output to the display device 304 by way of being superimposed on other data that should be displayed. This is an extremely effective means when an operator interactively operates a corresponding electronic apparatus. As a matter of course, it is also possible in this case to provide the display aligning device 303 with the above function in place of newly inserting a superimposing component between the display aligning device 303 and the display device 304 by separating them from each other.

Figure 6:
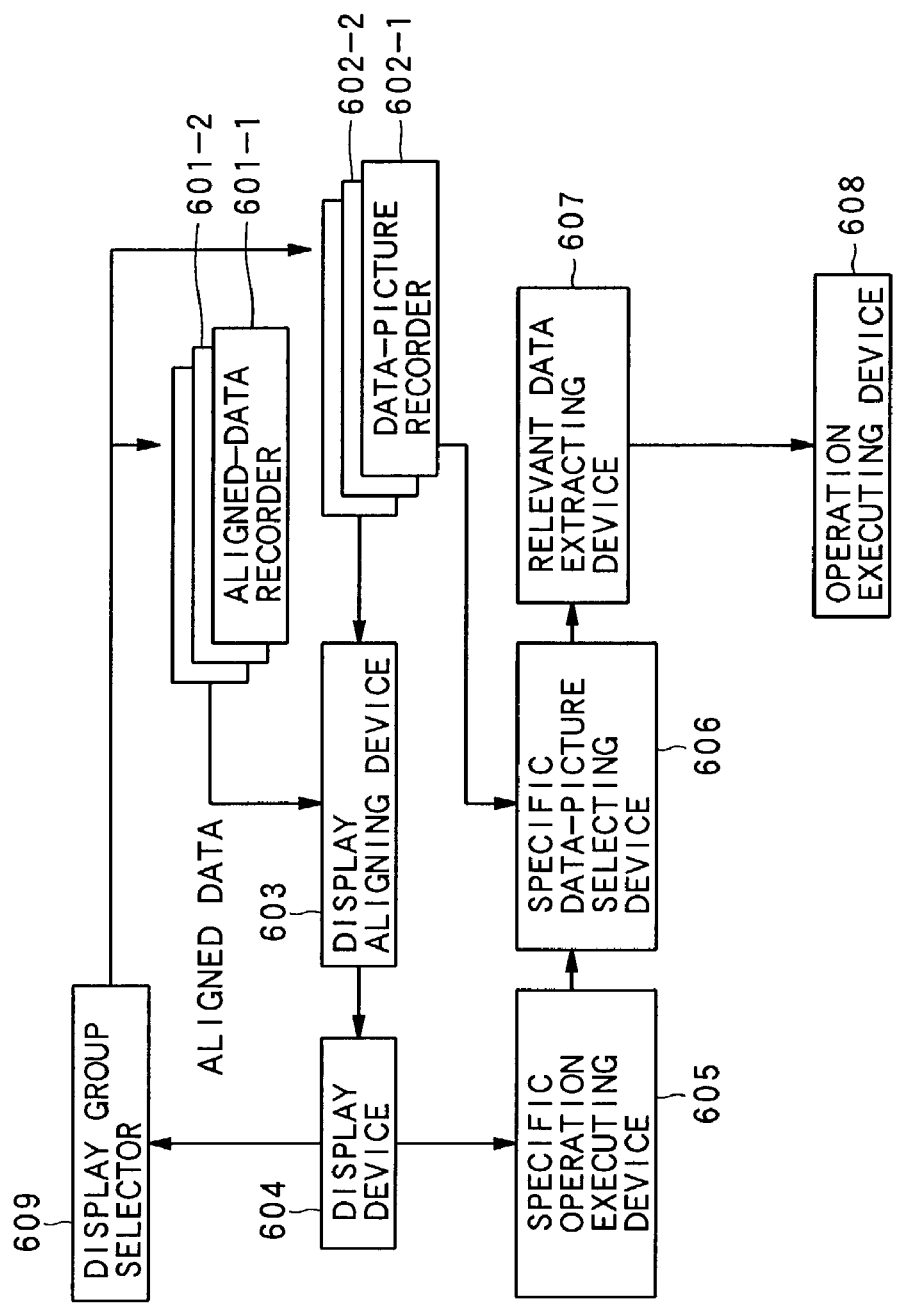
FIG. 6 presents a schematic block diagram of essential components of the electronic apparatus operating device according to the second form for implementing the present invention.

3: The Second Practical Form:

Referring now to FIG. 6, the second form for implementing the present invention is described below. FIG. 6 designates the inventive operating device capable of dealing with a plurality of operable objects.

3-1: Construction of the Operating Device of the Second Practical Form:

A plurality of aligned-data recorders 601-1, 601-2, . . . individually specify data pictures that should be displayed. These aligned-data recorders respectively record so-called "layout" data for designating a specific location of the display device 604 in order to display such a picture data pertaining to the specified data picture. For example, it is so arranged that such a file name representing specified data pictures and an HTML file designating its layout via tag description can be recorded in the above-referred recorders. Aligned data are discretely recorded per controllable electronic apparatus to be registered. When a control-objective electronic apparatus has been specified, recorded contents corresponding to the specified electronic apparatus are delivered to the display aligning device 603. The term "discrete recording" implies that the recorded contents may desirably be separated per electronic apparatus even when the recorded contents are not separated above the memory space.

A plurality of data-picture recorder 602-1, 601-2, . . . individually record at least data pictures that should be displayed. Picture data discretely recorded per controllable electronic apparatus to be registered. When a control-objective electronic apparatus has been specified, recorded contents corresponding to the specified electronic apparatus are delivered to the display aligning device 603. Also, the term "discrete recording" implies that the recorded contents may desirably be separated per electronic apparatus even when the recorded contents are not separated above the memory space.

A display aligning device 603 is connected to the aligned-data recorder 601 and the data-picture recorder 602. The display aligning device 603 acquires data from these recorders and then determines picture data that should be displayed on the display device 604 and yet also determines layout thereof. Concretely, the display aligning device 603 receives alignment data from the aligned data recorder 601 and then analyzes contents of the received alignment data. Next, based on the analyzed result, the display aligning device 603 extracts such an identifier of the displayable aligning data from the aligned data recorder 601, and then acquires the identifier before eventually determining its layout.

A display device 604 is disposed on the inventive operating device, which displays at least one of picture data of data pictures to enable an operator to visually discern it.

Specific operation executing device 605 is connected to the display device 604. When a picture data displayed on the display device 604 is specified by an operator (not shown), the specific operation executing device 605 acquires positional data related to the specified picture data. In this example, by way of utilizing a so-called touch type display panel, the display device 604 and the specific-operation executing device 605 can be integrated into a single device.

Specific data picture selector 606 is connected to the specific operation executing device 605 and the data picture recorder 602. The specific data picture selector 606 specifies a data picture related to such a picture data specified by an operator and then acquires the corresponding data picture from the data picture recorder 602. On the other hand, relevant data extractor 607 is connected to the specific data picture selector 606. The relevant data extractor 607 extracts relevant data from the specified data pictures. Operation executing device 608 is connected to the relevant data extractor 607. The operation executing device 608 converts the extracted relevant data into such codes that can be interpreted by an electronic apparatus operated by the inventive operating device and then outputs the encoded data.

When a certain electronic apparatus related to a controllable object present in any of the above recorders to be controllably operated by an operator is specified, display group selector 609 is designated by the operator. Based on this designation, the display group selector 609 selects such a recorded portion containing data related to a corresponding electronic apparatus among the aligned-data recorders 601-1, . . . and the data picture recorders 602-1, . . . .

3-2: Display Example in the Second Practical Form:

Referring now to FIGS. 7A and 7B, examples of display on the inventive device for operating an electronic apparatus are described below.

Two examples are presented for display. In a display example shown in FIG. 7A, by referring to display of tabs 701 and 702, such an electronic apparatus subject to controllable operation is selected. In this case, an operator selects an alternative means from manual touching of the tabs or depressing of the tabs with a stylus pen.

In another display example shown in FIG. 7B names of those electronic apparatuses subject to selection are serially displayed on the display device. When an operator selects any of them, a specific display panel corresponding to the selected apparatus is displayed. Although not only those which are exemplified in FIGS. 7A and 7B, but there are also a wide variety of conceivable examples of display and layout for selection, description of these conceivable examples is deleted.

3-3: Operation of the Inventive Device Under the Second Form:

Operation of the inventive operating device according to the second practical form of the present invention is described below. Inasmuch as the operation executed by the second practical form is substantially identical to that of the essential components of the preceding first form, only the difference is described below.

Irrespective of input means, whenever such a data containing specific data pictures requiring registration is received by the inventive operating device, the inventive operating device determines to utilize the aligned data recorder 601-1, . . . and/or the data picture recorder 602-1, . . . corresponding to individual electronic apparatuses. Selection of these recorders may be executed via manual means or an automatic means. When at least two or more than two of registrations are effected, the display group selector 609 perceives that there are more than two of the controllable objects, and then, demands the operator via the above-referred display means (including 701, 702, 703, and 704) to determine which one of the operating means should be implemented.

After selection of a specific operating means is effected by the operator, the display group selector 609 specifies the aligned data recorder and/or the data picture recorder corresponding to an objective electronic apparatus, and then, based on this data, activates operation of the display aligning device 603.

4: Additional Utility (1)

It should be understood that the above description has merely referred to actual forms for implementing the present invention, and thus, the above description does not define nor restrict the scope of the present invention as the concrete aspects for judging technical matters set forth in Claims.

For example, when realizing the construction described above in regard to practical forms for implementing the present invention on such a computer operated by the "Windows CE", in order to enable the computer to properly function itself as per the above inventive means, it is possible to distribute the inventive method in the form of a program. In this case, it is also allowable to distribute the program via a network service line or by applying a data recording medium such as a CD-ROM for example. Further, even when the inventive operating components are integrated into a module, it is also allowable to realize distribution of the above program via a network service line or by applying a data recording medium such as a CD-ROM for example.

5: Additional Utility (2)

Although data pictures are directly procured from an electronic apparatus 505 shown in FIG. 5, it is also possible to procure the required data pictures from a server via a network service line. In this case, it is possible for manufacturers of electronic apparatuses to distribute buttons bearing a variety of picture characters for example, whereby contributing to preserve and promote attractiveness of the electronic apparatuses.

INDUSTRIAL APPLICABILITY

According to the present invention, it is possible to integrate essential components of the above-described inventive device into a module, thus contributing to the improvement of productivity.

What is claimed is:

1. An electronic apparatus operating device comprising:
 a display device which displays at least one of picture data contained in a data picture comprising a picture data and a relevant data as a single dealing unit;
 a specific operation executing device which specifies said picture data displayed on said display device via operation;
 a relevant-data extractor which extracts a relevant data from a data picture;
 an interface device which, based on said extracted data, outputs a controlling data to another electronic apparatus;
 a data picture recorder which records said data picture; and
 a recording-medium interface device which initially reads a recorded data from an independent recording medium and then records said recorded data in said data-picture recorder.

2. The electronic apparatus operating device according to claim 1, wherein
 said interface device outputs said controlling data via a wireless transmission means.

3. The electronic apparatus operating device according to claim 1, wherein
 said data picture is acquired from an externally inserted recording medium.

4. An electronic apparatus operating device comprising:
 a display device which displays at least one of picture data contained in a data picture comprising a picture data and a relevant data as a single dealing unit;
 a specific operation executing device which specifies said picture data displayed on said display device via operation;
 a relevant-data extractor which extracts a relevant data from a data picture;
 an interface device which, based on said extracted data, outputs a controlling data to another electronic apparatus;
 a data-picture recorder which records said data picture; and
 a recording-medium interface device which initially reads a data picture recorded from a controlling-objective electronic apparatus and then records said recorded data in said data-picture recorder.

5. The electronic apparatus operating device according to claim 4, further comprising:
 a registration initiating operational device which receives an instruction to activate operation for initiating registration; and
 a recording-medium interface device which reads a recorded data picture from a controlling-objective electronic apparatus when said registration initiating operational device receives an instruction to initiate registration and then records said data picture in said data-picture recorder.

6. The electronic apparatus operating device according to claim 1, wherein
 said display device displays data pictures by way of integrating said data pictures into groups per electronic apparatus to be subject to controlling operation.

7. A recording medium which delivers said data pictures to the electronic apparatus operating device according to claim 3.

8. An electronic apparatus which delivers said data pictures to the electronic apparatus operating device according to claim 4.

* * * * *